(12) United States Patent
Aokura et al.

(10) Patent No.: US 7,728,429 B2
(45) Date of Patent: Jun. 1, 2010

(54) SEMICONDUCTOR DEVICE HAVING RECESSED CONNECTOR PORTIONS

(75) Inventors: Isamu Aokura, Osaka (JP); Toshiyuki Fukuda, Kyoto (JP); Yukitoshi Ota, Osaka (JP); Keiji Miki, Kyoto (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 11/826,673

(22) Filed: Jul. 17, 2007

(65) Prior Publication Data

US 2008/0087993 A1 Apr. 17, 2008

(30) Foreign Application Priority Data

Jul. 28, 2006 (JP) ............... 2006-205463

(51) Int. Cl.
*H01L 23/495* (2006.01)

(52) U.S. Cl. ............... 257/734; 257/E23.033; 257/E21.585; 257/673; 257/737; 257/738; 257/778; 257/772; 257/783; 257/698; 257/779

(58) Field of Classification Search .......... 257/E23.033, 257/673, E21.585, 696, 779, 778, 734, 738, 257/783, 780.782, 698, 772; 438/615
See application file for complete search history.

(56) References Cited

U.S. PATENT DOCUMENTS

| 5,872,393 | A  * | 2/1999 | Sakai et al. ............... 257/664 |
| 6,166,443 | A  * | 12/2000 | Inaba et al. ............... 257/777 |
| 6,208,525 | B1 * | 3/2001 | Imasu et al. ............... 361/783 |
| 7,145,231 | B2 * | 12/2006 | Hasebe et al. ............... 257/712 |
| 7,239,024 | B2 * | 7/2007 | Massingill ............... 257/737 |
| 7,291,929 | B2 * | 11/2007 | Tanaka et al. ............... 257/784 |
| 7,323,675 | B2 * | 1/2008 | Chen ............... 250/214.1 |
| 7,375,429 | B2 * | 5/2008 | Teshima et al. ............... 257/738 |
| 2002/0063319 | A1 * | 5/2002 | Huang et al. ............... 257/678 |
| 2003/0102570 | A1 * | 6/2003 | Imasu et al. ............... 257/778 |
| 2003/0134450 | A1 * | 7/2003 | Lee ............... 438/106 |
| 2004/0195699 | A1 * | 10/2004 | Massingill ............... 257/778 |
| 2005/0041278 | A1 * | 2/2005 | Matsuo ............... 359/290 |
| 2006/0076671 | A1 * | 4/2006 | Kariya et al. ............... 257/702 |
| 2006/0240595 | A1 * | 10/2006 | Lee et al. ............... 438/108 |
| 2007/0029670 | A1 * | 2/2007 | Shibayama et al. ......... 257/737 |
| 2007/0194433 | A1 * | 8/2007 | Suwa et al. ............... 257/700 |

FOREIGN PATENT DOCUMENTS

| JP | 9-64236 | 3/1997 |
| JP | 2001-102492 | 4/2001 |

* cited by examiner

*Primary Examiner*—Alexander O Williams
(74) *Attorney, Agent, or Firm*—Steptoe & Johnson LLP

(57) ABSTRACT

A semiconductor device in accordance with the present invention includes IC chips (semiconductor elements) (2, 3, 4) having solder bumps (24) (projecting electrodes) formed on electrode pads, and a first wiring board (1) having connection terminals (7) to which the respective solder bumps (24) of the IC chips (2, 3, 4) are connected, external connection terminals (8) for connection to an external apparatus, and conductor wires (9) provided in respective groove portions formed in a board surface and connected to the respective connection terminals (7). In spite of the reduced pitch of the conductor wires (9), the presence of the groove portions enables an increase in cross section, allowing a reduction in wiring resistance.

24 Claims, 7 Drawing Sheets

SEMICONDUCTOR DEVICE HAVING RECESSED CONNECTOR PORTIONS

FIELD OF THE INVENTION

The present invention relates to a semiconductor device and a method of manufacturing the semiconductor device, and in particular, to a semiconductor device comprising a semiconductor element (hereinafter referred to as IC chip) with projecting electrodes formed thereon and a wiring board, as well as a method of manufacturing the semiconductor device.

BACKGROUND OF THE INVENTION

Continuous development of more multifunctional and faster semiconductor devices has resulted in an increase in the number of electrode pads (hereinafter referred to as IC pads) provided on an IC chip for connections to an external circuit. Accordingly, a wire bonding scheme of connecting IC pads formed on the periphery of the IC chip to an external circuit via wires has reached performance limits. Thus, a flip chip scheme has been more frequently adopted which involves connecting the IC pads to the external circuit via bumps (projecting electrodes) in order to increase the number of IC pads while minimizing the size of the IC chip.

However, to mount an IC chip with a large number of IC pads on a mother board (mounting board) in an electronic apparatus in accordance with the flip chip scheme, it is necessary to match the land pitch of the mother board with the pad pitch of the IC pads. Consequently, the mother board must be an expensive wiring board on which fine wires can be formed. This is not economical.

Thus, attempts have been made to make wiring rules lenient by using, as an intermediate board (interposer), a resin board (for example, a buildup wiring board) or a ceramic wiring board produced in accordance with intermediate wiring rules between those for the pad pitch of the IC pads and those for an inexpensive mother board.

The interposer also serves to relax thermal stress imposed on solder connections between the IC pads (in actuality, bumps formed on the IC pads) on the IC chip and mounting lands on the mother board, that is, thermal stress resulting from a difference in the coefficient of liner thermal expansion between the IC chip and the mother board (see, for example, Japanese Patent Laid-Open No. 9-64236 and Japanese Patent Laid-Open No. 2001-102492).

However, for resin wiring boards, wires are formed using a plating technique called an additive method. Accordingly, the wiring pitch is limited in terms of the flatness of a base board. For ceramic wiring boards, wires are formed by printing with a conductive paste, preventing the formation of fine wires.

Thus, to cope with the further reduced pitch of the IC pads, a proposal has been made to use a silicon wiring board as a first interposer to increase the pad pitch and to connect the silicon wiring board to a second interposer (for example, a resin wiring board).

However, for silicon wiring boards, wires are formed by deposition or the like, preventing an increase in the cross section of each wire. The wiring resistance of connection wires thus poses a problem when the silicon wiring board is used as an interposer between a high-speed signal or large-current IC chip and an external circuit.

To cope with this problem, a proposal has been made of a structure in which a low-melting-point metal layer is integrally formed on a wiring layer comprising output signal wires or the like through which a relatively large current flows (see, for example, Japanese Patent Laid-Open 61-194744). With this structure, as shown in FIG. 7, a low-melting-point metal layer 103 is formed on a selected wire such as an aluminum wire 102 on a silicon wiring board 101 by a deposition process. The low-melting-point metal layer 103 is then melted and integrated with the wire, while being raised by surface tension. This increases the wiring cross section. The sectional shape of the low-melting-point metal layer 103 portion becomes semi-circular as shown in the figure.

However, for small-pitch wiring, the width of each wire itself needs to be reduced. It is thus difficult to increase the cross section even by raising the low-melting-point metal layer on the wire as described above.

DISCLOSURE OF THE INVENTION

In view of the above problems, an object of the present invention is to provide a semiconductor device including a wiring board on which semiconductor elements with projecting electrodes formed thereon are mounted, the wiring board having wires offering a reduced resistance in spite of a reduced pitch.

To accomplish the object, the present invention provides a semiconductor device comprising a semiconductor element including projecting electrodes formed on electrode pads and a first wiring board having internal connection terminals to which the projecting electrodes of the semiconductor element are connected, external connection terminals for connection to an external apparatus, and conductor wires provided in respective groove portions formed in a board surface and connected to the respective internal connection terminals. Thus, even if the conductor wires are arranged at a reduced pitch, the presence of the groove portions enables an increase in cross section. This in turn enables a reduction in wiring resistance.

Each of the conductor wires of the first wiring board may be a first conductor wire that connects the corresponding internal connection terminal directly to the corresponding external connection terminal. Each of the conductor wires may be also a second conductor wire that connects the corresponding internal connection terminals together. Each of the conductor wires may also include a first conductor wire that connects the corresponding internal connection terminal directly to the corresponding external connection terminal and a second conductor wire that connects the corresponding internal connection terminals together.

The semiconductor device may further comprise a second wiring board having a mounting portion on which the first wiring board is mounted, second internal connection terminals for connection to the respective external connection terminals of the first wiring board, second external connection terminals for connection to the external apparatus, and conductor portions each connecting the second internal connection terminal to the second external connection terminal, wires each connecting the corresponding external connection terminal of the first wiring board to the corresponding second internal connection terminal of the second wiring board, and a sealing resin provided on the second wiring board so as to wrap the semiconductor element, the first wiring board, and the wires.

An external connection electrode comprising solder may be formed on each of the external connection terminals of the first wiring board. Each of the projecting electrodes of the semiconductor element may be formed of solder.

A method of manufacturing a semiconductor device in accordance with the present invention comprises: preparing a semiconductor element having projecting electrodes and a first wiring board on which the semiconductor element is to be mounted; and mounting the semiconductor element on the first wiring board, wherein the first wiring board has internal connection terminals formed on a surface thereof and each located opposite the corresponding projecting electrode of the semiconductor element, external connection terminals formed on the surface thereof for connection to an external apparatus, and groove portions formed in the surface thereof for connection to the respective internal connection terminals and in each of which a conductor wire is formed.

Each of the projecting electrodes of the semiconductor element is advantageously formed of solder. An underlayer comprising the same material as that for the internal connection terminals and the external connection terminals is advantageously formed in each of the groove portions.

Specifically, in preparing the first wiring board, the groove portions each extending from the corresponding internal connection terminal to the corresponding external connection terminal are formed, and an external connection electrode comprising solder is formed on each of the external connection terminals. In mounting the semiconductor element, each of the internal connection terminals on the first wiring board is connected to the corresponding projecting electrode of the semiconductor element, while part of a molten electrode material for the projecting electrode and the external connection electrode is allowed to flow into the corresponding groove portion. As a result, first conductor wires can be formed on the first wiring board; at least a surface layer of each of the first conductor wires comprises the electrode material, and the first conductor wire connects the corresponding internal connection terminal to the corresponding external connection terminal.

In preparing the first wiring board, the groove portions each extending from a predetermined internal connection terminal to another predetermined internal connection terminal are formed, and a solder paste is placed in each of the groove portions by printing and then reflowed. As a result, second conductor wires each connecting the predetermined internal connection terminals together can be formed.

In the semiconductor device configured as described above, the internal connection terminals and the external connection terminals on the first wiring board are preferably provided in respective recessed portions formed in the board surface. Each of the internal connection terminals of the first wiring board is preferably provided in the corresponding recessed portion formed in the board surface. This allows a self-alignment effect to be utilized to prevent possible misalignment between each projecting electrode and the corresponding internal connection terminal of the wiring board and possible misalignment between each external connection terminal and the corresponding external connection electrode on the wiring board.

More preferably, the internal connection terminals and the external connection terminals on the first wiring board are each provided in a corresponding recessed portion formed in the board surface, and the recessed portion is connected to the corresponding groove portion with the corresponding first conductor wire provided therein and formed shallower than the groove portion. Preferably, the internal connection terminals and the external connection terminals on the first wiring board are each provided in a corresponding recessed portion formed in the board surface, and the recessed portion is connected to the corresponding groove portion with the first conductor wire and the second conductor wire provided therein and formed shallower than the groove portion. Preferably, each of the internal connection terminals of the first wiring board is provided in a corresponding recessed portion formed in the board surface, and the recessed portion is connected to the corresponding groove portion with the second conductor wire provided therein and is formed shallower than the groove portion. This limits a direction in which molten solder flows out when the projecting electrodes and the external connection electrodes are soldered, allowing the molten solder to flow easily into the groove portions.

Preferably, each of the external connection electrodes is formed on the corresponding external connection terminal of the first wiring board, and the external connection electrodes and the projecting electrodes of the semiconductor element comprise the same solder material.

At least a surface layer of each of the conductor wires of the first wiring board may comprise the same solder material as that of the projecting electrodes and the external connection electrodes.

Preferably, at least a surface layer of each of the conductor wires of the first wiring board is a solder layer, and an underlayer for the solder layer has a multilayer structure having a lowermost adhesion layer ensuring tight contact with an insulating film formed on the board surface including the groove portions and an uppermost solder wetting layer ensuring solder wettability. The adhesion layer may comprise at least one of Cr, Ti, TiW, and TiN, and the solder wetting layer may comprise at least one of Au, Ni, Pt, and Cu. The underlayer may comprise the same material as that for the internal connection terminals and the external connection terminals on the first wiring board.

The first wiring board may be a silicon wiring board. The silicon wiring board may be a circuit forming board comprising a silicon single-crystal board with semiconductor circuits formed thereon. The circuit forming board enables a reduction in the number of circuits on IC chips mounted on the silicon wiring board as well as an increase in the degree of freedom of layout.

Each of the conductor wires of the first wiring board preferably has a wider portion near the semiconductor element. Thus, after the semiconductor element is connected to the wiring board via the projecting electrodes (that is, in accordance with the flip chip scheme), when an underfill resin is provided as in the common practice, the wider portion can prevent the resin from flowing out to the periphery of the semiconductor element.

DESCRIPTION OF THE EMBODIMENTS

Embodiments of the present invention will be described below with reference to the drawings.

Figure 1A:
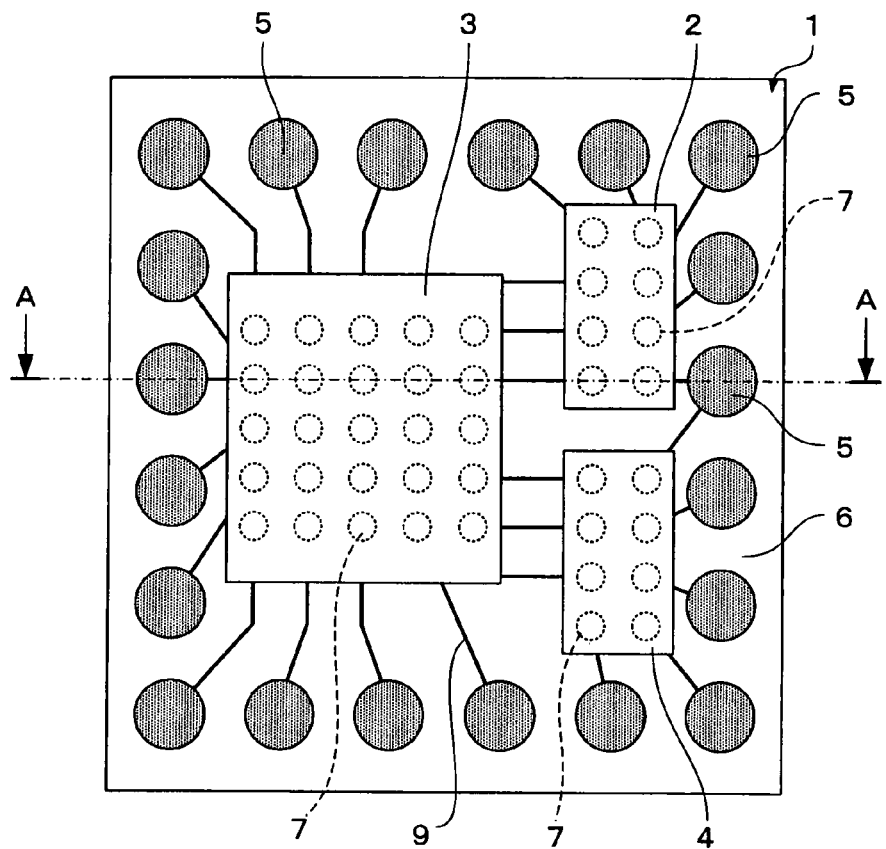
FIG. 1A is a plan view showing the general configuration of a semiconductor device in accordance with the present invention.
Figure 1B:
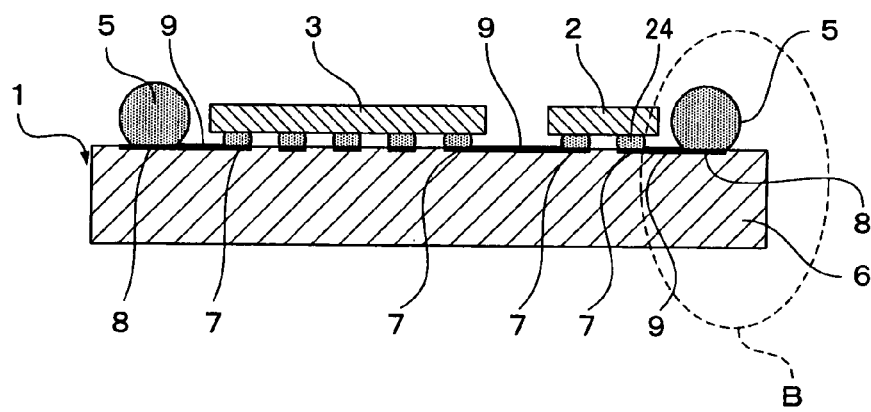
FIG. 1B is a sectional view of the semiconductor device taken along line A-A in FIG. 1A.
Figure 2A:
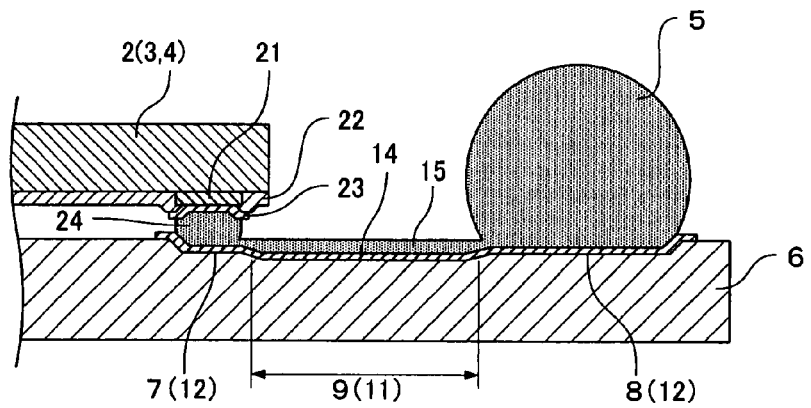
FIG. 2A is an enlarged diagram of a portion B of the semiconductor device in FIG. 1B.
Figure 2B:
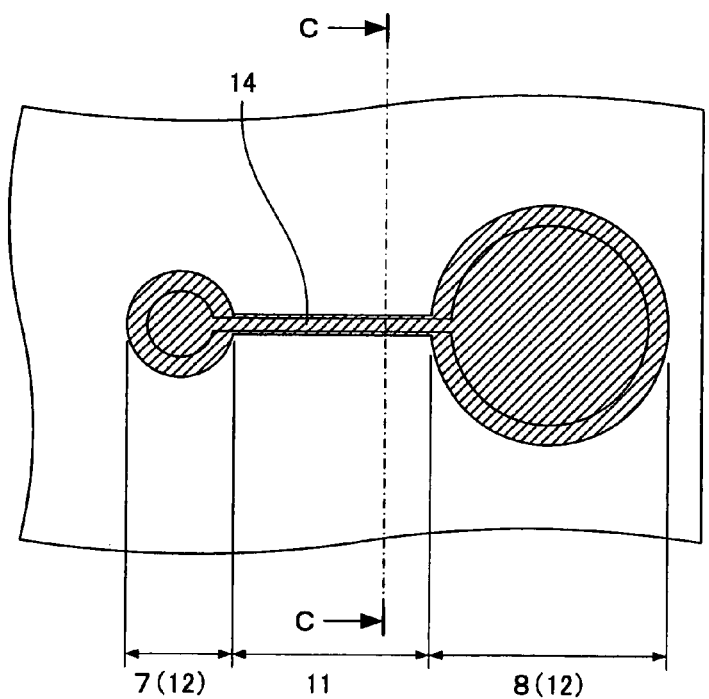
FIG. 2B is a plan view of a wiring portion of a wiring board constituting the semiconductor device.
Figure 2C:
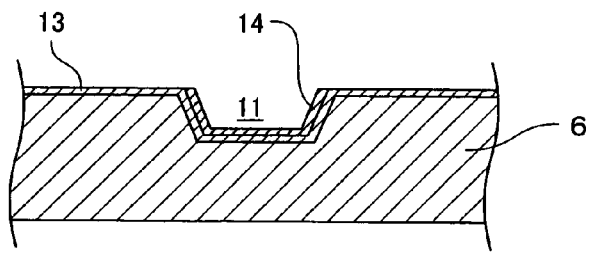
FIG. 2C is a sectional view of the wiring board taken along line C-C in FIG. 2B.

A semiconductor device shown in FIGS. 1 and 2 comprises a wiring board 1, IC chips 2, 3, and 4, and solder balls 5 serving as external connection electrodes (the numbers of IC chips and connection terminals on the wiring board are smaller than actual ones for easy understanding).

The wiring board 1 comprises a silicon board 6 comprising a plurality of connection terminals 7 provided in a central area of one of the surfaces of the silicon board 6, a plurality of external connection terminals 8 provided in an outer peripheral area of the above surface of the silicon board 6, and conductor wires 9 provided on the above surface of the silicon board 6 to electrically connect the connection terminals 7 to the respective external connection terminals 8. The plurality of connection terminals 7 are arranged in three predetermined areas of the wiring board 1, with the IC chips 2, 3, and 4 mounted on the respective areas. The solder balls 5 are formed on the respective external connection terminals 8.

In the description, the wiring board 1 (hereinafter referred to as the silicon wiring board 1) is a single-layer wiring structure with the conductor wires 9 formed on a front surface as shown in the figure. However, the wiring board 1 may be a multilayer wiring layer structure having internal wires formed of an Al layer. Moreover, the silicon wiring board 1 may be a circuit forming board comprising a silicon single-crystal board with semiconductor circuits formed thereon (that is, a semiconductor element). This enables a reduction in the number of circuits on IC chips mounted on the silicon wiring board 1 as well as an increase in the degree of freedom of layout. This in turn enables a reduction in the cost of the semiconductor device.

As shown in FIG. 2 in detail, in the silicon wiring board 1, groove portions 11 and recessed portions 12 are formed on the silicon board 6, for example, by a photolithography process and an etching process. For example, $SiO_2$ is used to form an insulating film 13 on the board surface including the groove portions 11 and the recessed portions 12. A metal thin film layer 14 is formed in the groove portions 11 and recessed portions 12 covered with the insulating film 13. A solder layer 15 is formed on the metal thin film layer 14 in the groove portions 11. The connection terminals 7 and the external connection terminals 8 correspond to the metal thin film layer 14 in the recessed portions 12. The conductor wires 9 correspond to the metal thin film layer 14 and solder layer 15 in the groove portions 11.

A protective film 22 (for example, polyimide) is formed on the IC chip 2 so as to have openings formed over respective IC pads 21 (Al electrodes). An under bump metal 23 is formed at each of the openings, and a solder bump 24 is formed on the under bump metal 23. The IC chip 2 is thus connected to the connection terminals 7 via the respective solder bumps 24. The IC chips 3 and 4 are similarly configured and are connected to the connection terminals 7 via the respective solder bumps 24.

The solder layer 15 is composed of the same material as that of the solder bumps 24 and the solder balls 5 (an Sn- or Pb-based material). Although not shown, the metal thin film layer 14, located under the solder layer 15, has a two-layer structure (or a structure with more layers) having an adhesion layer serving as a lower layer to ensure tight contact with the insulating film 13 and a solder wetting layer serving as an upper layer to ensure solder wettability. For example, Cr, Ti, TiW, or TiN is used as the adhesion layer. For example, Au, Ni, Pt, or Cu is used as the solder wetting layer.

The under bump metal 23, located under the solder bump 24, has a two-layer structure (or a structure with more layers) similarly to the metal thin film layer 14. The under bump metal 23 has an adhesion layer serving as a lower layer to ensure tight contact with the IC pad 21 and a solder wetting layer serving as an upper layer to ensure solder wettability. As is the case with the metal thin film layer 14, for example, Cr, Ti, TiW, or TiN is used as the adhesion layer. For example, Au, Ni, Pt, or Cu is used as the solder wetting layer.

Now, with reference to FIGS. 3 and 4, a description will be given of a method of manufacturing the semiconductor device described above. Actually, the silicon wiring board 1 is produced by forming a plurality of circuit wires in a matrix on a silicon wafer and separating the circuit wires from one another. However, for easy understanding, a part of an area to be formed into the silicon wiring board 1 is shown enlarged.

Figure 3A:
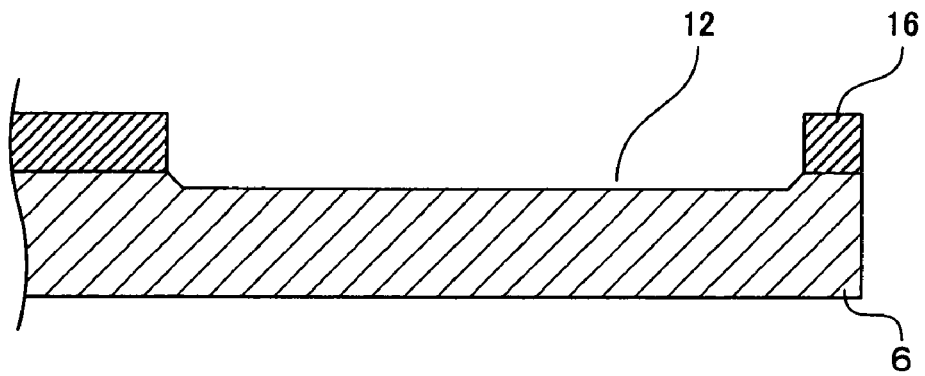
FIG. 3 is a sectional view illustrating the former half of a process of manufacturing the semiconductor device.

First, a photo resist 16 is applied all over the surface of the silicon board 6. A pattern is formed which corresponds to the conductor wires 9, the external connection terminals 8, and the connection terminals 7. The recessed portions 12 are formed in the silicon board 6 to a depth of 10 to 20 μm using, for example, the etching process (FIG. 3A). The etching process may involve wet etching using $HF+HNO_3$ mixed acid or the like, or dry etching such as plasma etching using gas such as $CF_4$, $CHF_3$, or Ar.

Figure 3B:
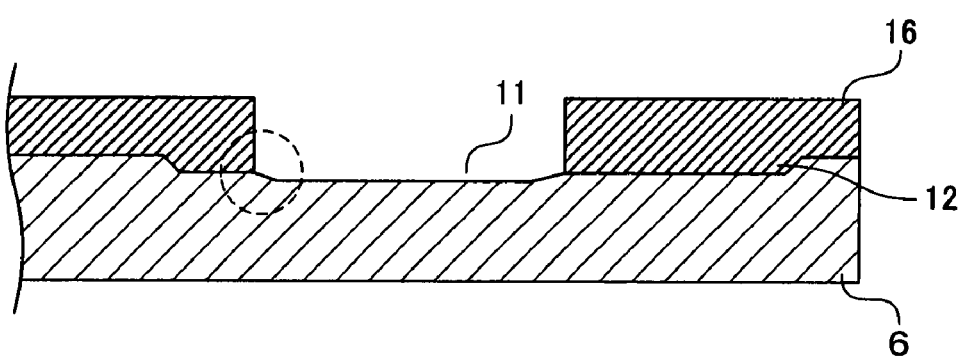

Then, the photo resist 16 is applied all over the surface of the silicon board 6 again. A pattern is formed which exposes only the recessed portions 12 corresponding to the conductor wires 9. The above etching process is used to perform further etching to form the groove portions 11 in the silicon board 6 to a depth of 20 to 50 μm (FIG. 3B).

At this time, the junction (enclosed by a dashed line) between each of the groove portions 11 and the corresponding recessed portion 12 is desirably tapered. This facilitates the inflow of molten solder described below. The tapered shape may be formed by isotropic etching with an etchant such as fluoric acid or nitric acid or isotropic dry etching with $CF_4$ in the above described etching process to etch only the groove portions 11.

Laser may be used instead of the etching process. Controlling output and irradiation time allows the recessed portions 12 and the groove portions 11 to be shaped similarly to those formed by the etching process.

Figure 3C:
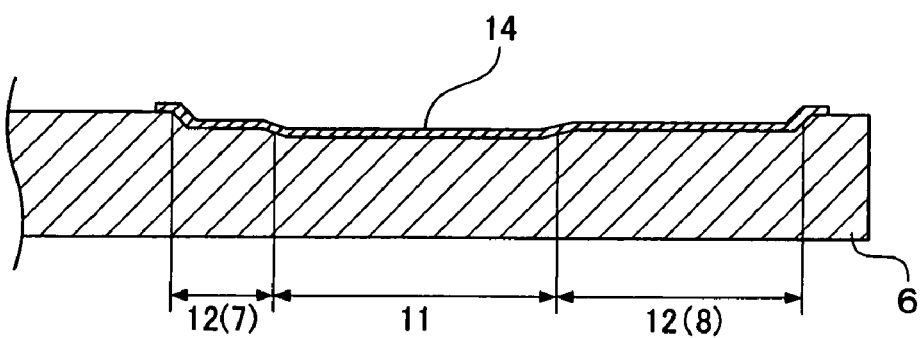

Once the groove portions 11 are formed, $SiO_2$ or the like is subjected to, for example, CVD to form an insulating film (see FIG. 2C described above) all over the surface of the wafer. The metal thin film layer 14 (the adhesion layer and solder wetting layer) is sequentially formed on the insulating film by, for example, sputtering. The groove portions 11 and the recessed portions 12 are then masked using a photo resist (not shown). The metal thin film layer 14 is then etched using a wet process. At this stage, the external connection terminals 8 and the connection terminals 7 are completed (FIG. 3C).

In this case, since the metal thin film layer 14 is used to ensure the wettability of the molten solder, the step coverage of the metal thin film layer 14 does not pose any problem. Consequently, the metal thin film layer 14 has only to be formed on the bottom surface of each of the groove potions 11 and the recessed portions 12. This facilitates production. In contrast, a conventional Cu damascene process involves electrolytic plating using the metal thin film layer 14 as a seed layer. Thus, in this case, the step coverage of the metal thin film layer 14 is important. When the metal thin film layer 14 is formed all over the surface of the wafer, the layer 14 needs to be formed not only on the bottom surface but also the side surface of each of the groove portions 11 and the recessed portions 12. It is very difficult to find optimum conditions under which the metal thin film layer 14 is continuously formed in each of the groove portions 11, having a high aspect ratio.

Figure 4A:
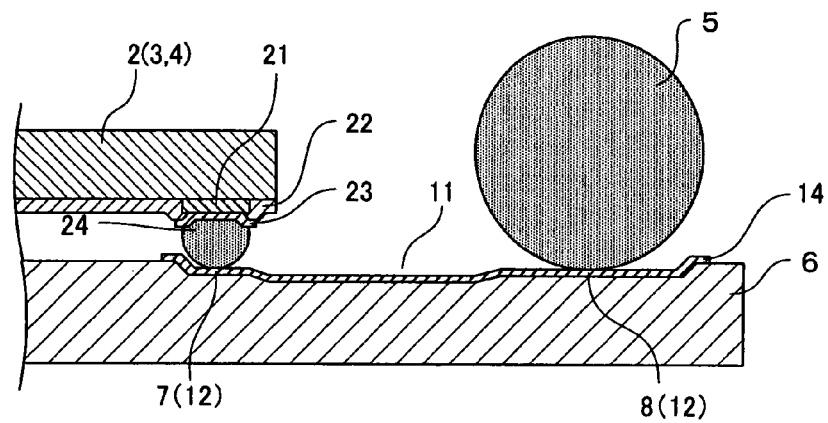
FIG. 4 is a sectional view illustrating the latter half of the process of manufacturing the semiconductor device.

After the etching of the metal thin film layer 14, a flux is applied all over the surface of the wafer, and the IC chips 2, 3, and 4 are mounted with the solder bumps 24 thereof aligned with the connection terminals 7. The solder balls 5 are placed on the respective external connection terminals 8 (FIG. 4A). In this case, the external connection terminals 8 and the connection terminals 7 are each formed by covering the corresponding recessed portion 12 with the metal thin film layer 14, and thus each have a recessed surface. The flux is collected in the recessed surface and the cohesion of the flux inhibits the solder bumps 24 and solder balls 5 from being misaligned.

Figure 4B:
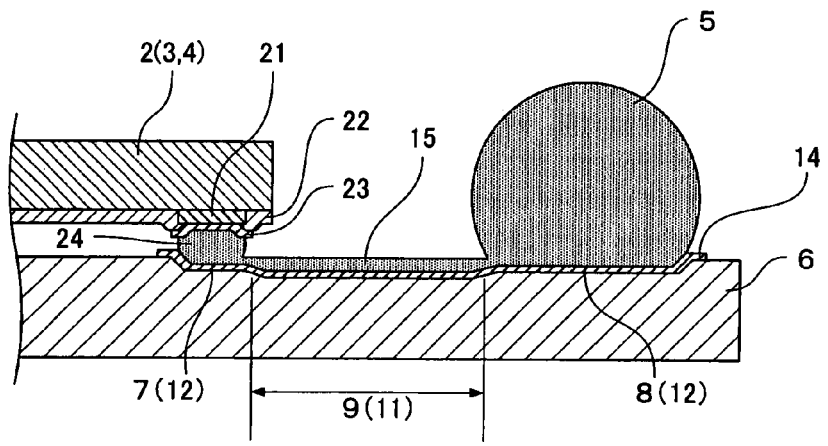

Then, reflowing is performed. Thus, each of the solder bumps 24 and the corresponding solder ball 5 are melted, so that the molten portions of the solder bump 24 and the solder ball 5 allow soldering. At the same time, the molten solder partly flows into the groove portion 11 under the effect of surface tension to form the solder layer 15. The molten solder flows out both from the solder bump 24 and from the solder ball 5, and the metal thin film layer 14 formed in the groove portion 11 has the metal with a high solder wettability on the surface thereof as described above. Consequently, the groove portion 11 is completely filled with the solder. The conductor wire 9 is quickly formed, which comprises the metal thin film layer 14 and the solder layer 15 and which has a large cross section. The solder bump 24, the connection terminal 7, the conductor wire 9, the external connection terminal 8, and the solder ball 5 are connected together via the solder material with the same composition (FIG. 4B).

Also in this case, owing to the recessed shape of the external connection terminal 8 and the connection terminal 7 and the depth of the groove portion 11 larger than that of the recessed shape, a direction in which the molten solder flows out is limited compared to that observed when the external connection terminal 8 and the connection terminal 7 are formed flat. This advantageously allows the molten solder to flow easily into the groove portion 11 and makes it possible to prevent the molten solder from flowing out in directions other than the one into the groove portion 11. This in turn improves the self-alignment effect of the IC chips 2, 3, and 4 and the solder balls 5 based on the surface tension of the molten solder. Further, since the solder ball 5 and the solder bump 24 comprise the solder material with the same composition, soldering can advantageously be achieved with the same temperature profile. This process is thus efficient and economical. However, the recessed portion 12 may be as deep as the groove portion 11. Moreover, the recessed portions 12 may be omitted and the external connection terminals 8 and the like may be provided on a plane.

Figure 4C:
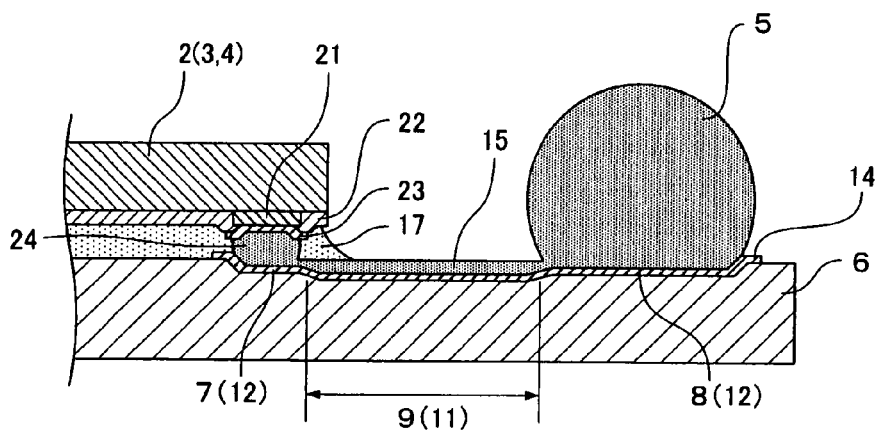

Subsequently, after a cleaning step, an underfill 17 (for example, a thermosetting epoxy resin such as bisphenol F) is injected into the gap between the IC chips 2, 3, and 4 and the wiring board 1. The underfill 17 is then thermally cured to complete a semiconductor device (FIG. 4C). The solder balls 5 are connected to the mounting board.

Figure 5A:
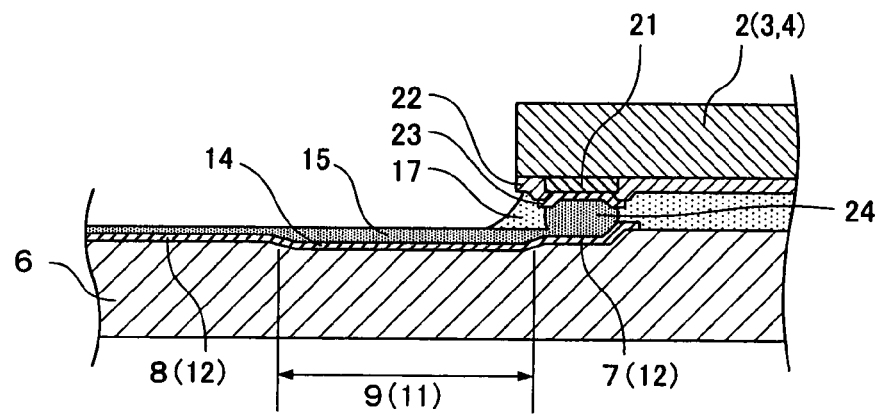
FIG. 5A is an enlarged sectional view showing a part of another semiconductor device in accordance with a second embodiment of the present invention.
Figure 5B:
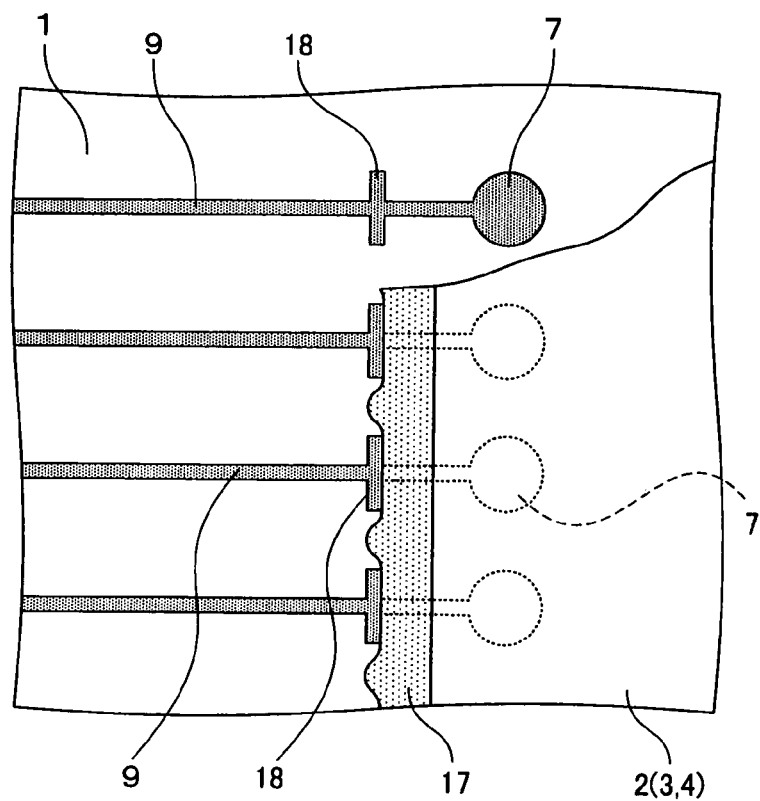
FIG. 5B is a partly cutaway top view of a part of the semiconductor device of FIG. 5A.

As shown in FIGS. 5A and 5B, a wider portion 18 may be formed on each of the conductor wires 9 of the silicon wiring board 1. When the conductor wires 9 are formed, the groove portions 11, the metal thin film layer 14, and the solder layer 15 are formed so as to form the wider portions 18.

In this case, various effects can be produced by appropriately selecting the depth and shape of a part of the groove portion 11 which is formed into the wider portion 18 (for example, a wave shape, a rectangle, an arc, and an arched shape are possible). The illustrated wider portions 18 extend along each of the four sides of the bottom surface of the IC chip 2, and are arranged in parallel at small intervals in the direction along each side of the bottom surface of the IC chip 2. This also applies to the IC chips 3 and 4.

The underfill 17 is conventionally injected into the gap between the IC chip 2 and the wiring board 1 as described above. In this case, the underfill 17 may flow out to the periphery of the chip, preventing the control of a fillet shape. Thus, a difference among the fillets on the four sides of the IC chip 2 may cause stress concentration in reliability tests on temperature cycles and the like. This affects the connection reliability of the solder bumps 24. Further, the bleeding underfill 17 may reach the external connection terminals 8, resulting in inappropriate mounting.

In contrast, in the semiconductor device shown in FIGS. 5A and 5B, the wider portions 18 of the conductor wires 9 are formed as described above. The bleeding underfill 17 is blocked by the wider portions 18 and inhibited from flowing further outward. Thus, the fillet shape can controllably be made uniform on the four sides of the IC chip 2. This makes it possible to avoid possible stress concentration to improve the connection reliability of the solder bumps 24. Further, the underfill 17 is prevented from reaching the external connection terminals 8, making it possible to inhibit inappropriate mounting.

Figure 6A:
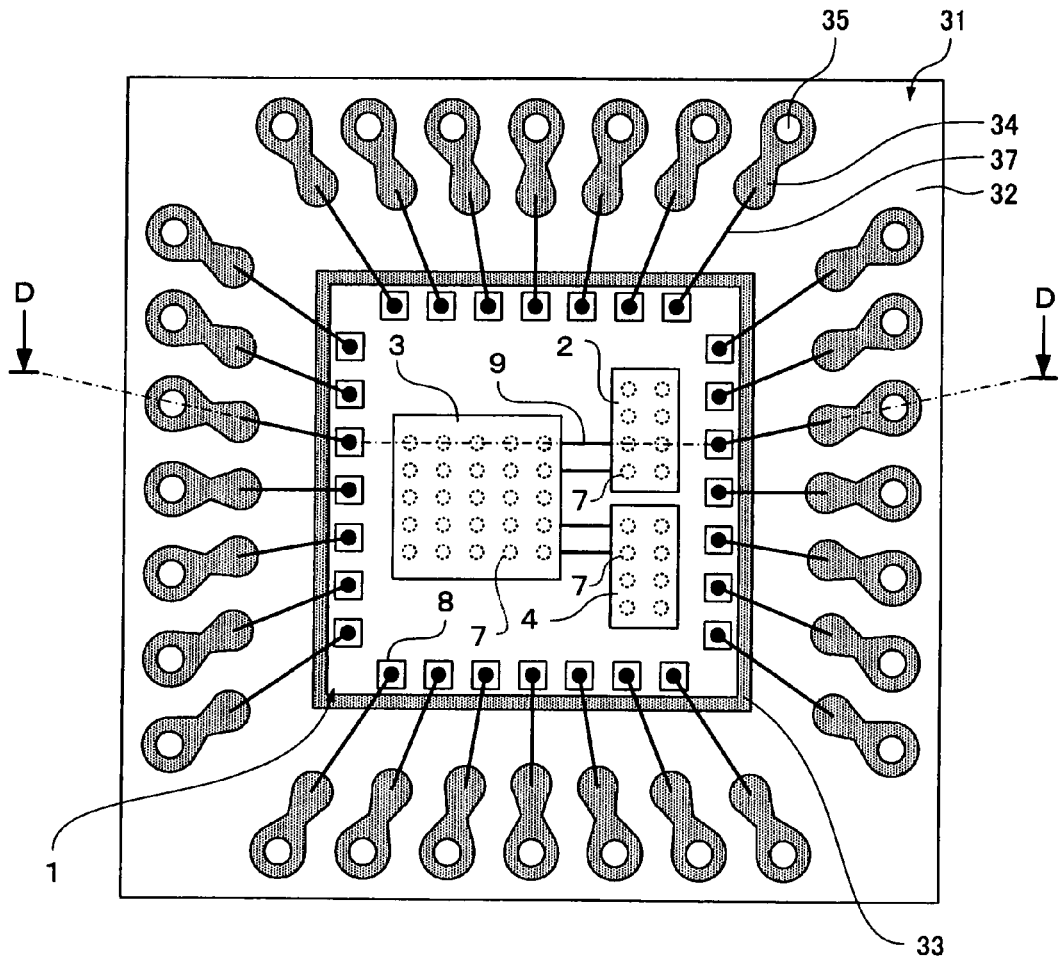
FIG. 6A is a plan view showing the configuration of yet another semiconductor device in accordance with the present invention.
Figure 6B:
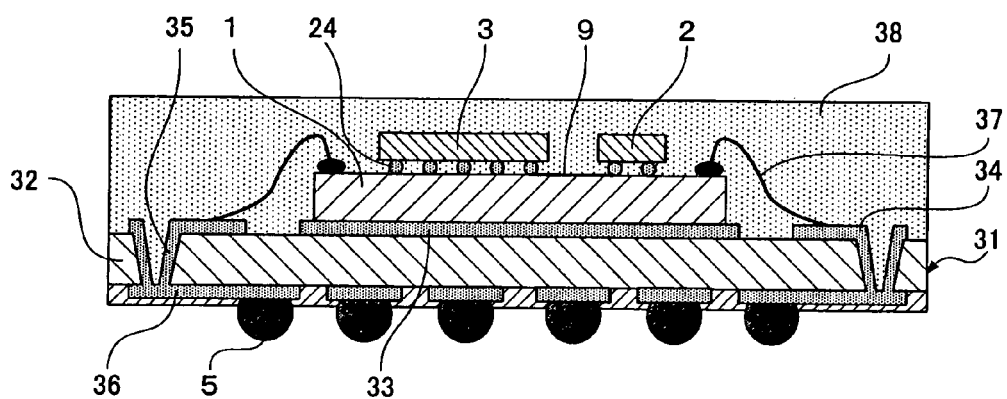
FIG. 6B is a sectional view of the semiconductor device taken along line D-D in FIG. 6A.
Figure 7:
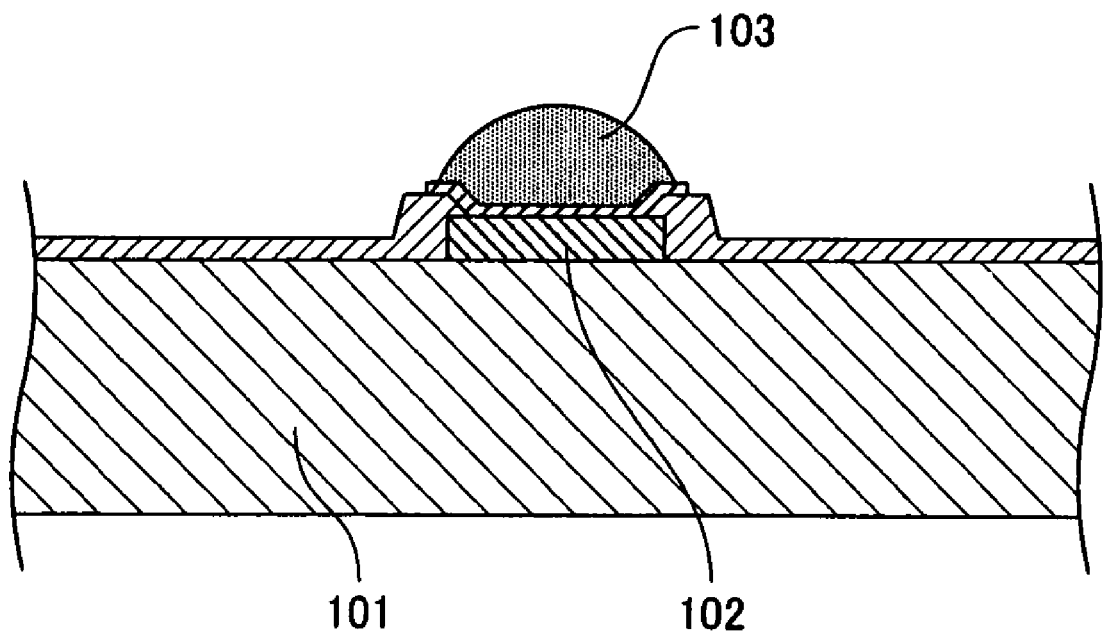
FIG. 7 is a sectional view of a wiring layer in a conventional semiconductor device.

A semiconductor device shown in FIGS. 6A and 6B comprises a silicon wiring board 1 similar to that described with reference to FIGS. 1A and 1B and mounted on a resin wiring board 31 in accordance with the flip chip scheme, and the IC chips 2, 3, and 4 mounted on the silicon wiring board 1. The silicon wiring board 1 has a multilayer wiring structure. The solder balls 5, shown in FIGS. 1A and 1B, are not present on the Al external connection terminals 8, electrically connected to the connection terminals 7.

The resin wiring board 31 may comprise any of various base materials such as glass fibers or fibers composed of organic substances such as KEVLAR (R) which are impregnated with an epoxy resin, a phenol resin, a polyimide resin, or the like and which are then cured, as well as a BT resin, as a base material 32. A die pattern 33, a plurality of lands 34, and through conductors 35 connected to the respective lands 34 are formed on an IC chip mounting surface of the resin wiring board 31. Conductor patterns 36 connected to the respective through conductors 35 are formed on a back surface of the resin wiring board 31. For example, a metal film of Ni or Au (not shown) is formed on the surface of each of the above components. The solder balls 5 are connected to the respective conductor patterns 36.

The silicon wiring board 1 is bonded to the die pattern 33 of the resin wiring board 31 with a conductive adhesive (not shown). The Al external connection terminals 8 of the silicon wiring board 1 are connected to the respective lands 34 of the resin wiring board 31 via respective wires 37. A sealing resin 38 is provided on the IC chip mounting side of the resin wiring board 31 so as to wrap the silicon wiring board 1, the IC chips 2, 3, and 4, and the wires 37.

That is, in this structure, to cope with the reduced pitch of the IC pads on the IC chips 2, 3, and 4, the silicon wiring board 1 is used as a first interposer to increase the pad pitch and is connected to the resin wiring board 31, serving as a second interposer.

On the silicon wiring board 1, the conductor wires 9 between the IC chips 2 and 3 and 4, through which signals are transmitted and received at a high speed, are constructed by forming the groove portions 11 and the metal thin film layers 14 and forming the solder layer 15 on the metal thin film layer 14 in each groove portion 11 as described above (see FIG. 2A, described above).

However, the solder layer 15 is formed by providing a solder paste (an Sn- or Pb-based material) by printing and then performing a reflow operation. This method enables the conductor wires 9 to be formed by providing the solder all over the wafer through a single application and thus constitutes an efficient, economical process. Each of the conductor wires 9 thus formed has a large cross section and can thus offer a reduced wiring resistance. Therefore, when used for high-speed signals between the IC chips 2 and 3 and 4, the conductor wires 9 make it possible to avoid possible defects such as signal delays.

As described above, the present invention allows the conductor wires having a large cross section in spite of a reduced pitch with a reduced resistance to be readily provided on the surface of the wiring board. The semiconductor device comprising the wiring board with the semiconductor elements mounted thereon enables high-speed signals or a large current to be transmitted between the semiconductor elements and between the semiconductor element and an external circuit. This makes it possible to prevent possible signal delays. That is, the present invention enables a very reliable semiconductor device to be inexpensively implemented. Such a semiconductor device is useful for various electronic apparatuses, notably in the field of portable electronic apparatuses.

What is claimed is:

1. A semiconductor device comprising:
    a wiring board having a principal surface, the principal surface having:
        a first recessed portion;
        a second recessed portion;
        a groove connected to the first recessed portion and the second recessed portion, the groove extending along the principal surface away from the first recessed portion; and
        an external connection electrode connected to the second recessed portion;
    a semiconductor element having a projecting electrode, the semiconductor element mounted on the wiring board with the projecting electrode connected to the first recessed portion; and
    a conductor wire located in the groove, the conductor wire, the external connection electrode and the projecting electrode comprising a same material,
    wherein the second recessed portion is more shallow than the groove.

2. The semiconductor device according to claim 1, wherein the conductor wire and the projecting electrode are made of solder.

3. The semiconductor device according to claim 1, wherein the conductor wire is connected directly to the projecting electrode.

4. The semiconductor device according to claim 1, wherein the first recessed portion is more shallow than the groove.

5. The semiconductor device according to claim 1, wherein the conductor wire, the projecting electrode, and the external connection electrode are made of solder.

6. The semiconductor device according to claim 1, wherein the conductor wire is connected directly to the projecting electrode and the external connection electrode.

7. The semiconductor device according to claim 1, wherein the wiring board further includes a metal layer located on the first recessed portion and the groove, the metal layer having a shape corresponding to a shape of the first recessed portion and the groove, respectively,
    the projecting electrode is connected to a first metal layer recessed portion located on the first recessed portion of the wiring board, and
    the conductor wire is located in a metal layer groove portion located on the groove of the wiring board.

8. The semiconductor device according to claim 7, wherein the wiring board further comprises an insulating film on at least the groove, and
    the metal layer has a multilayer structure comprising:
        a lowermost adhesion layer for ensuring tight contact with the insulating film located on the groove of the wiring board; and
        an uppermost solder wetting layer for ensuring solder wettability.

9. The semiconductor device according to claim 8, wherein the adhesion layer comprises at least one of Cr, Ti, TiW, and TiN, and the solder wetting layer comprises at least one of Au, Ni, Pt, and Cu.

10. The semiconductor device according to claim 8, wherein the metal layer comprises solder.

11. The semiconductor device according to claim 4, wherein the wiring board is a silicon wiring board.

12. The semiconductor device according to claim 11, wherein the silicon wiring board is a circuit forming board comprising a silicon single-crystal board with semiconductor circuits formed thereon.

13. The semiconductor device according to claim 1, wherein the conductor wire of the wiring board is wider near the semiconductor element.

14. A semiconductor device comprising:
    a first wiring board having a principal surface, the principal surface having:
        a first recessed portion,
        a groove connected to the first recessed portion, the groove extending along the principal surface away from the first recessed portion;
        a conductor wire located in the groove; and
        an external connection terminal;
    a semiconductor element having a projecting electrode, the semiconductor mounted on the first wiring board, such that the projecting electrode is connected to the first recessed portion;
    a second wiring board having the first wiring board mounted thereon, the second wiring board including:
        a mounting portion on which the first wiring board is mounted,
        an internal connection terminal,
        a wire connecting the internal connection terminal to the external connection terminal of the first wiring board,
        an external connection electrode, and
        a conductor portion connecting the internal connection terminal to the external connection electrode,
    wherein the conductor wire and the projecting electrode comprise a same material, and the semiconductor element, the first wiring board, and the wire are sealed by a sealing resin located on the second wiring board.

15. The semiconductor device according to claim 14, wherein the first recessed portion is more shallow than the groove.

16. The semiconductor device according to claim 14, wherein the conductor wire and the projecting electrode are made of solder.

17. The semiconductor device according to claim 14, wherein the conductor wire is connected directly to the projecting electrode.

18. The semiconductor device according to claim 14, wherein the first wiring board further includes a metal layer on the first recessed portion and on the groove of the principal surface, the metal layer having a shape corresponding to a shape of the first recessed portion and the groove, respectively, the projecting electrode is connected to a first metal layer recessed portion located on the first recessed portion of the first wiring board, and the conductor wire is located in a metal layer groove portion located on the groove portion of the first wiring board.

19. The semiconductor device according to claim 18, wherein the first wiring board further comprises an insulating film on at least the groove, and the metal layer has a multilayer structure comprising:
a lowermost adhesion layer for ensuring tight contact with said insulating film located on the groove of the wiring board; and
an uppermost solder wetting layer for ensuring solder wettability.

20. The semiconductor device according to claim 19, wherein the adhesion layer comprises at least one of Cr, Ti, TiW, and TiN, and the solder wetting layer comprises at least one of Au, Ni, Pt, and Cu.

21. The semiconductor device according to claim 19, wherein the metal layer comprises solder.

22. The semiconductor device according to claim 14, wherein the first wiring board is a silicon wiring board.

23. The semiconductor device according to claim 22, wherein the silicon wiring board is a circuit forming board comprising a silicon single-crystal board with semiconductor circuits located thereon.

24. The semiconductor device according to claim 14, wherein the conductor wire of the first wiring board has a wider portion near the semiconductor element.

* * * * *